| United States Patent [19] | [11] | Patent Number: | 4,877,711 |
|---|---|---|---|
| Aoai et al. | [45] | Date of Patent: | Oct. 31, 1989 |

[54] LIGHT-SENSITIVE DIAZO PHOTOPOLYMERIZABLE COMPOSITION WITH POLYURETHANE HAVING CARBON-CARBON UNSATURATED AND A CARBOXYL GROUP

[75] Inventors: Toshiaki Aoai; Kazuo Maemoto; Akihiko Kamiya; Hiroshi Misu, all of Shizuoka, Japan

[73] Assignee: Fuji Photo Film Co., Ltd., Minami-Ashigara, Japan

[21] Appl. No.: 48,949

[22] Filed: May 12, 1987

[30] Foreign Application Priority Data

May 19, 1986 [JP] Japan .................. 61-114342

[51] Int. Cl.$^4$ .................. G03C 1/60; G03C 1/70
[52] U.S. Cl. .................. 430/176; 430/175; 430/270; 430/281; 430/284; 430/906; 430/177
[58] Field of Search ............... 430/175, 176, 270, 281, 430/284, 906, 177

[56] References Cited

U.S. PATENT DOCUMENTS

| 2,770,612 | 11/1956 | Schollenberger | 525/440 |
|---|---|---|---|
| 2,871,218 | 1/1959 | Schollenberger | 528/272 |
| 3,551,154 | 12/1970 | Di Blas | 430/192 |
| 3,660,097 | 5/1972 | Mainthia | 430/175 |
| 3,790,385 | 2/1974 | Steppan et al. | 430/175 |
| 3,890,152 | 6/1975 | Ruckert et al. | 430/175 |
| 4,123,276 | 10/1978 | Kita et al. | 430/286 |
| 4,171,974 | 10/1979 | Golda et al. | 430/175 |
| 4,172,729 | 10/1979 | Narutomi et al. | 430/175 |
| 4,186,017 | 1/1980 | Palmer | 430/175 |
| 4,289,838 | 9/1981 | Rowe et al. | 430/163 |
| 4,687,727 | 8/1987 | Toyama et al. | 430/175 |

FOREIGN PATENT DOCUMENTS

| 6615389 | 11/1966 | Netherlands | 430/17 C |
|---|---|---|---|
| 2044788 | 10/1980 | United Kingdom | 430/175 |
| 2185120 | 7/1987 | United Kingdom | 430/175 |

Primary Examiner—Charles L. Bowers, Jr.
Attorney, Agent, or Firm—Burns, Doane, Swecker & Mathis

[57] ABSTRACT

A light-sensitive composition which contains a polyurethane resin having a carbon-carbon unsaturated bond and a carboxyl group. A presensitized plate using the above light-sensitive composition can be developed with an aqueous alkaline developing solution and provides a lithographic printing plate having excellent printing durability.

14 Claims, No Drawings

LIGHT-SENSITIVE DIAZO PHOTOPOLYMERIZABLE COMPOSITION WITH POLYURETHANE HAVING CARBON-CARBON UNSATURATED AND A CARBOXYL GROUP

FIELD OF THE INVENTION

The present invention relates to a negative working light-sensitive composition, and particularly to a light-sensitive composition which can be developed with an aqueous alkaline developing solution and can preferably be used for light-sensitive making presensitized plates from which lithographic printing plates having high printing durability are to be prepared.

The present invention relates also to a light-sensitive composition which has an excellent photocrosslinking property, can be developed with an aqueous alkaline developing solution and can preferably be used for making presensitized plates from which lithographic printing plates having high printing durability are to be prepared.

PRIOR ART

Most of light-sensitive substances used in negative working presensitized printing materials are diazonium compounds. Ones which are most used among these are diazo resins such as a formaldehyde condensate of p-diazodiphenylamine.

Composition of the light-sensitive layer of presensitized plates using diazo resins can be classified into the compositions of diazo resins alone, i.e., the compositions having no binder as described in U.S. Pat. No. 2,714,066, and the compositions in which a binder and the diazo resin are mixed as described in Japanese Patent Application (OPI) No. 30604/1975. Most of the recent presensitized plates using diazonium compounds are composed of the diazonium compounds and polymers as a binder in order to yield high printing durability.

For such a light-sensitive layer, there are known, as described in Japanese Patent unexamined and published application (hereinafter referred to as OPI (open to public inspection)) No. 30604/1975, a so-called alkaline developing type in which unexposed areas are removed (developed) with an aqueous alkaline developing solution and a so-called solvent developing type in which unexposed areas are removed with an organic solvent developing solution. The alkaline developing type is give attention by reason of the safety and health for workers. The known binders useful for such an alkaline developing type light-sensitive layer include polymers obtained by copolymerizing 2-hydroxyethyl (meth)acrylate and a carboxy group- containing monomer such as methacrylic acid as described in the aforesaid OPI 30604/1975 and polymers in which carboxyl group is introduced by reacting the hydroxyl group of a polyvinyl alcohol with a cyclic anhydride such as phthalic anhydride. However, the obtained polymers have poor abrasion resistance due to their structure. Lithographic printing plates obtained from presensitized plates containing such a binder in a light-sensitive layer always show poor printing durability. Meanwhile, polyvinyl acetals form tenacious films and have good abrasion resistance, but have a disadvantage that it can yield only presensitized plates of the organic solvent developing type.

Further, polyurethane resins are known as polymers which have excellent abrasion resistance. Japanese Patent Publication No. 36961/1974 (which corresponds to U.S. Pat. No. 3,660,097) and OPI No. 94346/1981 disclose, respectively, compositions in which a diazonium compound and a substantially linear polyurethane resin are combined, and compositions in which a diazonium salt condensate and a branched polyurethane resin are composed. However, these polyurethane resins do not contain an alkalisoluble group and therefore show insufficient solubility in an aqueous alkaline developing solution. It was very difficult to develop a presensitized plate in which a light-sensitive layer is composed of a light-sensitive composition containing the above polyurethane resins as a binder, without leaving the film remained in unexposed areas. Further, the polyurethane resins had disadvantages that they did not form an image of sufficient strength because these did not have cites for causing photoreaction with a combined diazonium compound upon exposure to be crosslinked effectively.

On the other hand, there are many attempts to use photopolymerizable composition for the light-sensitive image-forming layer of a negative working presensitized plate. There are known a basic composition composed of a polymer as a binder, a monomer and a photopolymerization initiator as disclosed in Japanese Patent Publication No. 32714/1971, a composition in which hardening efficiency is improved by introducing an unsaturated double bond into a polymer as a binder as disclosed in Japanese Patent Publication No. 34041/1974 and compositions in which novel photopolymerization initiators are used as disclosed in Japanese Patent Publication Nos. 38403/1973 and 27605/1978 and U.K. Pat. No. 1,388,492 and some of them have been used in practice. However, all of these light-sensitive compositions have disadvantages that their sensitivity depends largely upon the surface temperature of a presensitized plate at the time of image exposure and that polymerization is bindered by oxygen at the time of image exposure.

SUMMARY OF THE INVENTION

An object of the invention is to overcome the aforesaid disadvantages and provide a novel light-sensitive composition which has an excellent developing property to an aqueous alkaline developing solution and which provides a lithographic printing plate having high printing durability.

It has now been found that this object can be attained by a novel light-sensitive composition of the present invention, which contains a polyurethane resin having a carbon-carbon unsaturated bond and a carboxyl group.

According to a preferred embodiment of the present invention, there is provided a light-sensitive composition which contains the polyurethane resin as described above but further having a hydroxyl and/or nitrile group and a diazonium compound.

DETAILED DESCRIPTION OF THE INVENTION

"Carbon-carbon unsaturated bond" herein means and includes both ethylene and acetylene bonds with the ethylene bond being preferred.

The aforesaid polyurethane resin can be used alone as a light-sensitive composition according to the present invention. However, the polyurethane resin is preferably used in the following combination systems:

(1) a combination system of the polyurethane resin of the present invention with a photopolymerization initiator and/or a sensitizer, (2) a combination system of the polyurethane resin of the present invention with a diazonium compound, (3) a combination system of the polyurethane resin of the present invention with a monomer having at least one polymerizable, ethylenically unsaturated group, and a photopolymerization initiator and/or a sensitizer, (4) a combination system of the polyurethane resin of the present invention with a photopolymerization initiator and/or a sensitizer, and a diazonium compound, and (5) a combination system of the polyurethane resin of the present invention with a monomer having at least one polymerizable, ethylenically unsaturated group, a photopolymerization initiator and/or a sensitizer and a diazonium compound.

The polyurethane resin preferably used in the present invention includes polyurethane resins whose basic skeleton is a reaction product of a diisocyanate compound represented by the following general formula (I) with a diol compound having a carboxyl group represented by general formula (II) or (III).

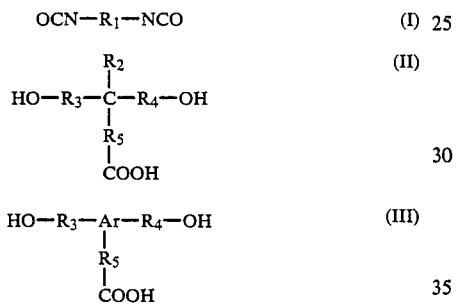

Wherein, $R_1$ represents a divalent aliphatic or aromatic hydrocarbon which may have substituents (for instance, alkyl, alkenyl, aralkyl, aryl, alkoxy and halogeno groups are preferred). When necessary, $R_1$ may contains other functional groups unreactive with isocyanate group, such as ester, urethane, amide and ureido groups and a carbon-carbon unsaturated bond.

$R_2$ represents a hydrogen atom, alkyl, alkenyl, aralkyl, aryl, alkoxy or aryloxy group, all of which may have substituents (for instance, alkyl, aryl, alkoxy, ester, urethane, amide, ureido and halogeno groups are preferred), with a hydrogen atom, alkyl or alkenyl of 1 to 8 carbon atoms and aryl of 6 to 15 carbon atoms being preferred. $R_3$, $R_4$ and $R_5$ may be same or different and represent a single bond or divalent aliphatic or aromatic hydrocarbon which may have substituents (for instance, alkyl, alkenyl, aralkyl, aryl, alkoxy and halogeno groups are preferred), with alkylene of 1 to 20 carbon atoms, arylene of 6 to 15 carbon atoms being preferred. The alkylene group of 1 to 8 carbon atoms is particularly preferred. When necessary, $R_3$, $R_4$ and $R_5$ may contain other functional groups unreactive with isocyanate group, such as ester, urethane, amide, ureido groups and a carbon-carbon unsaturated bond. Further, two or three out of $R_2$, $R_3$, $R_4$ and $R_5$ may form a ring.

Ar represents a trivalent aromatic hydrocabron which may have substituents with an aromatic group of 6 to 15 carbon atoms being preferred.

The diisocyanate compound represented by general formula (I) includes aromatic diisocyanate compounds such as 2,4-tolylene diisocyanate, a dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate and 3,3'-dimethylbiphenyl-4,4'-diisocyanate; aliphatic diisocyanate compounds such as hexamethylene diisocyanate, trimethylhexamethylene diisocyanate, lysin diisocyanate and dimeric as isophorone diisocyanate, 4,4'-methylenebis(cyclohexylisocyanate), methylcyclohexane-2,4(or 2,6)diisocyanate and 1,3-(isocyanatomethyl)-cyclohexane; and diisocyanate compounds as reaction products from diols and diisocyanates such as an adduct of 1 mole of 1,3-butyleneglycol and 2 moles of tolylene diisocyanate.

The diol compound having a carboxyl group represented by general formula (II) or (III) includes 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid and tartaric acid.

The carbon-carbon unsaturated bond contained in the polyurethane resin according to the invention may be introduced by reacting a part of carboxyl groups of the compound of general formula (II) or (III) with a halogen compound or epoxy compound having a carbon-carbon unsaturated bond in the presence of a base. Preferred examples of the above halogen compound and epoxy compound include allyl bromide, 2-butenyl bromide, 1-phenyl-1-propenyl-3-bromide, 2-bromoethyl cinnamate, bromomethylstyrene, propargyl bromide, bromo-2-butyne, the corresponding halogen atom-containing compounds of the above bromide atom-containing compounds, such as chlorine atom-containing compounds, and epoxy compounds such as allylglycidylether, 2-butenylglycidylether, 1-phenylpropenylglycidylether, glycidylacrylate, glycidylmethacrylate, glycidylcinnamate and propargylglycidylether.

Further, the carbon-carbon unsaturated bond may be introduced into the polyurethane resin by using a diol compound having a carbon-carbon unsaturated bond together with the diol compound of general formula (II) or (III). As preferred diol compounds, there may be used 2-butenediol, 4,4'-dihydroxystilbene, dihydroxyethylfumarate, dihydroxyethylmaleate dihydroxyethyl p-phenylenediacrylate, 4,4'-dihydroxychalcone, 1,4-dihydroxy-2-butene and 1,6-dihydroxy-2,4-hexadiyne.

The hydroxyl and/or nitrile group which may optionally be contained in the polyurethane resin of the present invention may be introduced also by reacting a part of carboxyl groups of the compound of general formula (II) or (III) with a halogen compound having a hydroxyl and/or nitrile group in the presence of a base. Examples of the above halogen compound include ethylenebromohydrin, 3-bromopropanol, 4-bromobutanol, 1-bromo-2-propanol, 4-hydroxy-2,3,5-tribromotoluene, cyanoethylbromide, 3-cyanopropylbromide, 4-cyanobutylbromide, 4-cyanobenzylbromide and chlorine atom-containing compounds corresponding to the above bromine atom-containing compounds.

Further, in the case of the nitrile group, it may be introduced into the polyurethane resin by using a diol compound having a nitrile group together with the diol compound of general formula (II) (III).

The polyurethane resin of the present invention may be prepared from two or more of the diisocyanate compounds or general formula (I) and two or more of the diol compounds having a carboxyl group of general formula (II) or (III).

It is possible to jointly use a diol compound which has no carboxyl group and may have other substituents unreactive with isocyanate in such an amount that alkaline developing property is not deteriorated.

Examples of such diol compounds include ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, ethyleneoxide adduct of bisphenol A, propyleneoxide adduct of bisphenol A, ethyleneoxide adduct of bisphenol F, propyleneoxide adduct of bisphenol F, ethyleneoxide adduct of hydrogenated bisphenol A, propyleneoxide adduct of hydrogenated bisphenol A, hydroquinonedihydroxyethylether, p-xylylene glycol, dihydroxyethylsulfone, bis(2-hydroxyethyl)-2,4-tolylenedicarbamate, 2,4-tolylene-bis(2-hydroxyethylcarbamide), bis(2-hydroxyethyl)-m-xylylenedicarbamate and bis(2-hydroxyethyl)isophthalate.

The polyurethane resin of the present invention is synthesized by heating the aforesaid diisocyanate compound and diol compound in an aprotic solvent with the addition of a known catalyst which has an activity proper to reactivity of each case. A mole ratio of diisocyanate to diol is preferably 0.8:1 to 1.2:1. Where the isocyanate group remains at the end of the polymer, the synthesis is completed by treatment with alcohols, amines or the like without leaving the isocyanate group remained.

The weight average molecular weight of the polyurethane resin of the present invention is preferably 1,000 or more, particularly in a range of from 5,000 to 100,000.

These polymeric compounds may be used alone or in combination. The content of these polymeric compounds in the light-sensitive composition is about 30 to 95% by weight, preferably about 50 to 90% by weight.

Other resins may also be mixed into the light-sensitive composition of the present invention in an amount of at most 50% by weight based on the aforesaid polymer. Examples of such mixed resins include polyamide resin, epoxy resin, polyacetal resin, acryl resin, methacryl resin, polystylene type resin and novolak phenolic resin.

The monomer having at least one polymerizable, ethylenically unsaturated group which may be added to the light-sensitive composition of the present invention is a monomer which has a boiling point of 100° C. or higher at normal pressure, at least one, preferably at least two, addition-polymerizable, ethylenically unsaturated group in a molecule, and a molecular weight of 10,000 or less, or oligomers. Examples of such monomers and oligomers include monofunctional acrylate and methacrylate such as polyethyleneglycol mono(meth)acrylate, polypropyleneglycol mono(meth)acrylate and phenoxyethyl(meth)acrylate; those obtained by adding ethyleneoxide or propyleneoxide to polyvalent alcohol such as glycerin or trimethylolethane and then (meth)acrylating it, such as polyethyleneglycol di(meth)acrylate, polypropyleneglycol di(meth)acrylate, trimethylolethane tri(meth)acrylate, neopentylglycol di(meth)acrylate, pentaerythritol tri(meth)acrylate, pentaerythritol tetra(meth)acrylate, dipentaerythritol hexa(meth)acrylate, hexanediol di(meth)acrylate and tri(acryloyloxyethyl)isocyanate; urethaneacrylates as described in Japanese Patent Publications 41708/1973 and 6034/1975, and OPI 37193/1976, polyfunctional acrylate and methacrylate such as polyester acrylates, epoxy acrylate obtained by reacting an epoxy resin with (meth)acrylic acid as described in OPI 64183/1973, Japanese Patent Publications 43191/1974 and 30490/1977. The photocuring monomers and oligomers described in Nippon Secchaku Kyokai Si (Japan Adhesion Association Bulletin) Vol. 20, No. 7, p 300-308, may also be used.

The composition ratio by weight of these monomers or oligomers to the polyurethane resin of the present invention is preferably 5:95 to 70:30, and particularly 10:90 to 50:50.

Examples of the photopolymerization initiator capable of being added to the composition of the present invention include vicinal polyketaldonyl compounds as described in U.S. Pat. No. 2,367,660, α-carbonyl compounds as described in U.S. Pat. Nos. 2,367,661 and 2,367,670, acyloin ethers as described in U.S. Pat. No. 2,448,828, aromatic acyloin compounds substituted at α-hydrocarbon as described in U.S. Pat. No. 2,722,572, multibranched quinone compounds as described in U.S. Pat. Nos. 3,046,127 and 2,951,758, combination of triaryl imidazole dimer/p-aminophenyl ketone as described in U.S. Pat. No. 3,549,367, benzothiazole type compounds as described in U.S. Pat. No. 3,870,524, acridine and phenazine compounds as described in U.S. Pat. No. 3,751,259 and oxadiazole compounds as described in U.S. Pat. No. 4,212,970.

Trihalomethyl-S-triazine compounds or trihalomethyloxadiazole compounds represented by the following general formula (IV) or (V) is preferred.

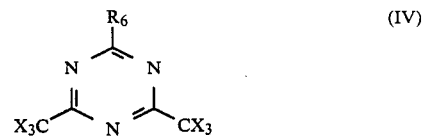

(IV)

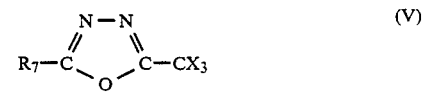

(V)

wherein, $R_7$ represents a substituted or unsubstituted aryl or alkenyl group, and $R_6$ represents $R_7$, $-CX_3$ or a substituted or unsubstituted alkyl group. X represents a chlorine or bromine atom.

The compounds represented by general formula (IV) include the compounds described in Wakabayashi et al., Bull. Chem. Soc. Japan, Vol. 42, p 2924 (1969), and the compounds described in U.K. Patent 1,388,492 and German Pat. Nos. 2,718,259 and 3,337,024, for instance, 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine, trichloroethyl)-4,6-bis(trichloromethyl)-S-triazine, 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl-S-triazine, 2-(4-methoxy-naphth-1-yl)-4,6-bis(trichloromethyl)-S-triazine, 2-(4-ethoxy-naphth- 1-yl)-4,6-bis(trichloromethyl)-S-triazine, 2-[4-(2-ethoxyethyl)naphth-1-yl]-4,6-bis(trichloromethyl)-S-triazine, 2-(4,7-dimethoxy-naphth-1-yl)-4,6-bis(trichloromethyl)-S-triazine, 2-(acenaphth-5-yl)-4,6-bis(trichloromethyl)-S-triazine, 2-(4-stylylphenyl)-4,6-bis(trichloromethyl)-S-triazine.

The compounds represented by general formula (V) include the compounds described in OPI Nos. 74728/1979, 77742/1980 and 148784/1984, for instance, 2-styryl-5-trichloromethyl-1,3,4-oxadiazole, 2-(4-chlorostyryl)-5-trichloromethyl-1,3,4-oxadiazole, 2-(4-methylstyryl)-5-trichloromethyl-1,3,4-oxadiazole, 2-(4-methoxystyryl)-5-trichloromethyl-1,3,4-oxadiazole, 2-(4-buthoxystyryl)-5-trichloromethyl-1,3,4-oxadiazole, 2-(4-styrylstyryl)-5-trichloromethyl-1,3,4-oxadiazole, 2-phenyl-5-trichloromethyl-1,3,4-oxadiazole, 2-(4-methoxyphenyl)-5-trichloromethyl-1,3,4-oxadiazole, 2-(3,4-dimethoxyphenyl)-5-trichloromethyl-1,3,4-oxadiazole, 2-(4-styrylphenyl)-5-trichloromethyl-1,3,4-oxadiazole, and 2-(1-naphthyl)-5-trichloromethyl-1,3,4-oxadiazole.

The sensitizers which may be added to the light-sensitive composition of the invention include aromatic thiazole compounds as described in Japanese Patent Publication No. 28328/1984, merocyanine dyes as described in OPI No. 151024/1979, aromatic thiopyrylium salt and aromatic pyrylium salt, and light absorbants such as 9-phenyl acrydine, 5-nitroacenaphthene and ketocoumarin. Further, systems of combination with hydrogen donors such as N-phenylglycine, 2-mercaptobenzothiazole, and ethyl N,N'-dimethylaminobenzoate.

The photopolymerization initiator and/or sensitizer in the present invention is usually used in a range of from 0.01 to 20% by weight based on the total amount of the photopolymerizable, ethylenically unsaturated compound and the polyurethane resin of the present invention, and preferably in a range of from 0.5 to 10% by weight.

The diazonium compound used in the present invention includes the diazonium compounds described in U.S. Pat. No. 3,867,147, the diazonium compounds described in U.S. Pat. No. 2,632,703. Diazo resins exemplified by condensates of an aromatic diazonium salt and, for instance, a carbonyl containing compound such as formaldehyde are particularly useful. Preferred diazo resins include hexafluorophosphorate and tetrafluoroborate of a condensate of p-diazodiphenylamine and formaldehyde or acetaldehyde. Further, sulfonate of a condensate of p-diazodiphenylamine and formaldehyde (for instance, p-toluenesulfonate, dodecylbenzenesulfonate and 2-methoxy-4-hydroxy-5-benzoylbenzenesulfonate), phosphinate (for instance, benzenephosphinate), salts of hydroxy group-containing compounds (for instance, 2-4-dihydroxybenzophenone salt) and organic carboxylate are also preferred.

In addition, mesitylene sulfonate of a condensate of 3-methoxy-4-diazo-diphenylamine and 4,4'-bis-methoxy-methyldiphenylether as described in OPI 27141/1983 is also suitable.

The content of these diazonium compounds in the light-sensitive composition is 1 to 50% by weight, preferably 3 to 20% by weight. If necessary, two or more diazonium compounds may be used together.

It is desirable to add a small amount of a thermal-polymerization inhibitor to the aforesaid fundamental components of the present invention during the preparation or storing of the light-sensitive composition in order to prevent unnecessary thermal polymerization of the polymerizable, ethylenically unsaturated compound. Examples of preferred thermalpolymerization inhibitors include hydroquinone, p-methoxyphenol, di-tert.-butyl-p-cresol, pyrogallol, tert.butylcatechol, benzoquinone, 4,4'-thiobis(3-methyl-6-tert.butylphenol), 2,2'-methylenebis(4-methyl-6-tert.-butylphenol), 2-mercaptobenzoimidazole and N-nitrophenylhydroxyamine cerous salt.

If necessary, the light-sensitive composition of the present invention may be improved on its performance by adding dyes, pigments, stabilizers, fillers, surfactants, plasticizers and so on. Examples of preferred dyes include C.I. 26105 (Oil Red RR), C.I. 21260 (Oil Scarlet No. 308), C.I. 74350 (Oil Blue), C.I. 52015 (Methylene Blue), C.I. 42555 (Crystal Violet) and C.I. 42595 (Victoria Pure Blue).

Examples of the stabilizers include phosphoric acid, phosphrous acid, oxalic acid, p-toluene sulfonic acid, dipicolinic acid, malic acid, tartaric acid, 2-methoxy-4-hydroxy-5-benzoyl-benzenesulfonic acid, butylnaphhalene sulfonic acid and p-hydroxybenzene sulfonic acid.

The light-sensitive composition of the present invention is usually dissolved in a solvent and then coated on a proper substrate, dried and used. The coated amount of the composition is about 0.1 to 5 $g/m^2$, preferably 0.3 to 3 $g/m^2$ after drying.

Examples of the solvent used include methanol, ethanol, isopropanol, n-butanol, t-butanol, 2-methoxyethanol, 1-methoxy-2-propanol, 2-ethoxyethanol, 2-methoxyethylacetate, ethylene glycol, tetrahydrofurane, dioxane, dimethyl sulfoxide, N,N-dimethyl formamide, acetone, methylethylketone and mixtures thereof.

Examples of the substrate on which the light-sensitive composition of the present invention include paper, paper laminated with plastics (for instance, polyethylene, polypropylene and polystyrene), metal plates such as aluminium including aluminium alloys, zinc and copper, films of plastics such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinylacetal, paper or plastic film laminated or vapor deposited with the aforesaid metals. Among these, the aluminium plate is particularly preferred on account of the remarkable dimensional stability and the low price. Further, composite sheets of a polyethylene terephthalate film on which an aluminium sheet is bonded are also preferable, such as described in Japanese Patent Publication No. 18327/1973.

In the case of a substrate which has a metallic surface such as aluminium surface, it is preferred that surface processing is conducted in advance, such as graining, dipping into an aqueous solution of sodium silicate, potassium fluorozirconate or phosphate or anodization. Further, an aluminium plate subjected to dipping into an aqueous sodium silicate solution as described in U.S. Pat. No. 2,714,066, an aluminium plate subjected to anodization and then dipping into an aqueous alkali metal silicate as described in Japanese Patent Publication No. 5125/1972, an aluminium substrate processed with a combination of mechanical roughening and electrolytic roughening are also preferably used. The aforesaid anodization is carried out by letting a current flow with the aluminium plate being an anode in an electrolytic solution of one or more selected from an aqueous or non-aqueous solution of, for instance, organic acid such as phosphoric acid, chromic acid, sulfuric acid and boric acid, or organic acid such as oxalic acid and sulfuric acid, and salts thereof.

Further, one which is subjected to sealing process after graining and anodization is also preferred. The sealing process is carried out by dipping into an aqueous sodium silicate solution and a hot aqueous solution including hot water and organic or inorganic salt, and bathing in water vapor.

Electrodeposition of silicate as described in U.S. Pat. No. 3,658,662 is also effective.

Further, it is also useful to process an electrograined substrate by the aforesaid anodization and sodium silicate treatment as described in Japanese Patent Publication Nos. 27481/1971 and OPIs 58602/1977 and 30503/1977.

In addition, one which is subjected to brush graining, electorgraining, anodization and, further, sodium silicate treatment is also useful.

After these processings, it is also preferable to undercoat it with water-soluble resins such as polyvinylphosphonic acid, polymers and copolymers having sulfonic acid group in a side chain and polyacrylic acid.

These water-attracting treatments are conducted not only to make the surface of a substrate hydrophilic but also to prevent undesired reactions of the light-sensitive composition provided on it and, further, to enhance adherence of the light-sensitive layer.

On the layer of the light-sensitive composition provided on the substrate, a protective layer consisting of a polymer having excellent oxygen barrier such as polyvinyl alcohol and acidic celluloses may be provided to completely prevent polymerization inhibition action of oxygen in air. Methods of coating such a protective layer are described in detail, for instance, in U.S. Pat. No. 3,458,311 and Japanese Patent Publication No. 49729/1980.

The light-sensitive composition of the present invention coated on a substrate is exposed through a transparent original film having a line image or dotted image and developed with an aqueous developing solution to yield a negative relief image of the original image.

Examples of a light source to be used for exposure include a carbon arc lamp, mercury lamp, xenon lamp, tungsten lamp and metal halide lamp.

Examples of preferred developing solutions include aqueous alkali solution containing a small amount of an organic solvent such as benzylalcohol, 2-phenoxy ethanol and 2-butoxy ethanol as described in, for instance, U.S. Pat. Nos. 3,475,171 and 3,615,480.

The developing solutions described in OPI 26601/1975 and Japanese Patent Publications Nos. 39464/1981 and 42860/1981 are also excellent as a developing solution for the aforesaid light-sensitive composition.

The light-sensitive composition of the present invention has excellent solubility in an organic coating solvent when being coated on a substrate and has excellent developing property when unexposed areas are developed with an alkaline developing solution after coating, drying and exposure to an image. The resulting relief image shows excellent abrasion resistance, ink-receptivity and adherence to a substrate, and yields many pieces of excellent printed matter when being used as a printing plate.

Further, the light-sensitive composition in which the polyurethane resin further having hydroxy and/or nitrile group and a diazonium compound are used in combination causes photocrosslinking effectively.

The invention will be further explained by the following synthesis examples and working example, which should not be construed as restrictive.

SYNTHESIS EXAMPLE 1

In a 500 ml 3-necked round-bottom flask provided with a condenser and a stirrer, 125 g (0.50 mole) of 4,4'-diphenylmethane diisocyanate and 67 g (0.50 mole) of 2,2-bis(hydroxymethyl)propionic acid were added and dissolved in 90 g of dioxane. One gram of N,N-diethyl aniline was added as catalyst and heated under reflux with stirring for 6 hours. Then, the reaction solution was poured into a solution of 4 l of water and 40 g of acetic acid with stirring to precipitate a white polymer. The polymer was filtered, washed with water and dried in vacuo. 185 g of the polymer were obtained.

The weight average (polystyrene standard) molecular weight of the polymer was 28,000 determined by gel permeation chromatography (GPC). The content of carboxyl group was 2.47 meq/g determined by titration.

Then, 40 g of this polymer were placed in a 300 ml 3-necked round-bottom flask provided with a condenser and a stirrer and dissolved in 200 ml of DMF, to which solution 6.3 g (0.062 mole) of triethyl amine were added and, after being heated to 80° C., 7.5 g (0.062 mole) allyl bromide were added with stirring over 10 minutes. Stirring was continued for additional two hours.

After the completion of reaction, the reaction solution was poured in a solution of 4 l of water and 200 g of acetic acid with stirring to precipitate a white polymer. The polymer was filtered, washed with water and dried in vacuo. 41 g of the polymer were obtained.

NMR measurement confirmed that allyl group was introduced into carboxyl group. The content of the remaining carboxyl group was 1.19 meq/g determined by titration (polyurethan (a) according to the present invention).

SYNTHESIS EXAMPLES 2 to 16

Polyurethane resins having carboxyl group were first synthesized as in Synthesis Example 1 using the diisocyanate and diol compounds shown in Table 1. Then, the polyurethane resins of the present invention were synthesized by reacting a part of carboxyl groups of the above polyurethane resins with the compounds shown in Table 1. NMR measurement confirmed that the above compounds were introduced into the carboxyl group. The molecular weights were determined by GPC. The contents of the remaining carboxyl group were determined by titration, which are shown in Table 1.

The molecular weight was 15,000 to 55,000 on the weight average (polystyrene standard).

TABLE 1

| Poly-urethane of the Invention | Diisocyanate Compound Used (mole %) | Diol Compound Used (mole %) | Compound Reacted with Carboxyl Group (mole %) | Content of Remaining Carboxyl Group (meq/g) |
|---|---|---|---|---|
| (b) (Synthesis Example 2) | OCN—(CH$_2$)$_6$—NCO (100) |  (100) | CH$_2$=CH—CH$_2$—Br (100) | 1.21 |
| (c) (Synthesis Example 3) |  (100) |  (100) | CH$_2$=CH—CH$_2$—Br (100) | 1.22 |
| (d) (Synthesis Example 4) |  (100) |  (100) | CH$_2$=CH—CH$_2$—Br (80)<br>HO—CH$_2$CH$_2$—Br (20) | 1.18 |
| (e) (Synthesis Example 5) |  (100) |  (100) | CH$_2$=CH—CH$_2$—Br (80)<br>HO—CH$_2$CH$_2$—Br (20) | 1.17 |
| (f) (Synthesis Example 6) |  (100) |  (70) + HO—(CH$_2$CH$_2$—O)$_7$H (30) | CH$_2$=CH—CH$_2$—Br (80)<br>HO—CH$_2$CH$_2$—Br (20) | 1.22 |
| (g) (Synthesis Example 7) |  (50) + OCN—(CH$_2$)$_6$—NCO (50) |  (100) | CH$_2$=CH—⌬—CH$_2$Cl (100) | 1.20 |

TABLE 1-continued

| Polyurethane of the Invention | Diisocyanate Compound Used (mole %) | Diol Compound Used (mole %) | Compound Reacted with Carboxyl Group (mole %) | Content of Remaining Carboxyl Group (meq/g) |
|---|---|---|---|---|
| (h) (Synthesis Example 8) | structure (50) + OCN(CH₂)₆NCO (50) | HO—CH₂—C(CH₃)(COOH)—CH₂—OH (60) + HO—Ar—CO—CH=CH—Ar—OH (40) | HO—CH₂CH₂—Br (100) | 1.19 |
| (i) (Synthesis Example 9) | MDI-type (60) + OCN(CH₂)₆NCO (40) | HO—CH₂—C(CH₃)(COOH)—CH₂—OH (100) | CH₂=CH—CH₂—Br (80) HO—CH₂CH₂—Br (20) | 1.21 |
| (j) (Synthesis Example 10) | MDI-type (60) + OCN(CH₂)₆NCO (40) | HO—CH₂—C(CH₃)(COOH)—CH₂—OH (60) + HOCH₂CH₂—OCO—CH=CH—Ar—CH=CH—COO—CH₂CH₂—OH (40) | HO—CH₂CH₂—Br (100) | 1.20 |

TABLE 1-continued

| Polyurethane of the Invention | Diisocyanate Compound Used (mole %) | Diol Compound Used (mole %) | Compound Reacted with Carboxyl Group (mole %) | Content of Remaining Carboxyl Group (meq/g) |
|---|---|---|---|---|
| (k) (Synthesis Example 11) |  (70) + 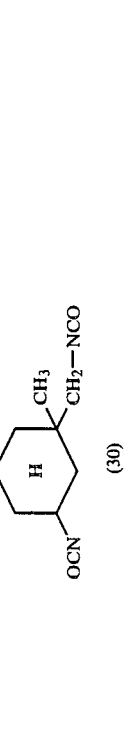 (30) | HO—CH₂—C(CH₃)(COOH)—CH₂—OH (100) | CH₂=CH—CH₂—Br (80) HO—CH₂CH₂—Br (20) | 1.16 |
| (l) (Synthesis Example 12) |  (70) + 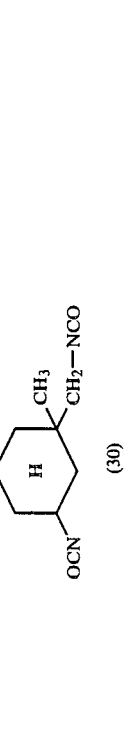 (30) | HO—CH₂—C(CH₃)(COOH)—CH₂—OH (100) |  (100) | 1.23 |
| (m) (Synthesis Example 13) | 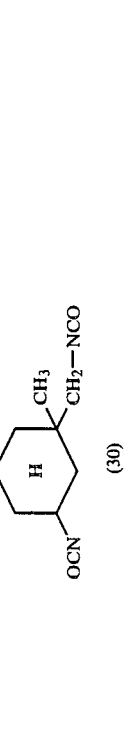 (60) + (m-xylylene diisocyanate) (40) | HO—CH₂—C(CH₃)(COOH)—CH₂—OH (70) + HO—CH₂—CH=CH—CH₂—OH (30) | CH₂=CH—CH₂—Br (80) HO—CH₂CH₂—Br (20) | 1.18 |

TABLE 1-continued

| Polyurethane of the Invention | Diisocyanate Compound Used (mole %) | Diol Compound Used (mole %) | Compound Reacted with Carboxyl Group (mole %) | Content of Remaining Carboxyl Group (meq/g) |
|---|---|---|---|---|
| (n) (Synthesis Example 14) | ![H3C-/-NCO + OCN-/-CH3 (60)] OCN—(CH₂)₆—NCO (40) | HO—CH₂—C(CH₃)(COOH)—CH₂—OH (100) | CH₂=CH—CH₂—Br (80) HO—CH₂CH₂—Br (20) | 1.20 |
| (o) (Synthesis Example 15) | [4,4'-methylenebis(phenyl isocyanate)] (70) + OCN—(CH₂)₆—NCO (30) | HO—CH₂—C(CH₃)(COOH)—CH₂—OH (100) | CH₂=C(CH₃)—COO—CH₂CH—CH₂ (epoxide) (70) Br—CH₂CH₂—CN (30) | 1.07 |
| (p) (Synthesis Example 16) | [4,4'-methylenebis(phenyl isocyanate)] (60) + [m-xylylene diisocyanate] (40) | HO—CH₂—C(CH₃)(COOH)—CH₂—OH (100) | CH₂=CH—CH₂—Br (80) Br—CH₂CH₂—CN (20) | 1.12 |

EXAMPLE

An aluminium plate of 0.24 mm in thickness was grained using a nylon brush and an aqueous dispersion of 400 mesh pumice and then washed sufficiently with water. This was etched by dipping it in a 10% aqueous sodium hydroxide solution at 70° C. for 60 seconds, washed with running water, washed with 20% nitric acid for neutralization and subjected to the electrochemical roughening process described in OPI No. 67507/1978 where a sinusoidal alternating wave current of anoidic voltage of 12.7 V and cathodic voltage of 9.1 V was used, the electrolytic solution was a 1% aqueous nitric acid solution and the anode time quantity of electricity was 160 coulomb/dm². Subsequently, this was dipped in a 30% aqueous sulfuric acid solution, desmutted at 55° C. for 2 minutes and then subjected to anodization in a 7% aqueous sulfuric acid solution to yield the amount of the aluminium oxide coating of 2.0 g/m². This was then dipped in a 3% aqueous sodium silicate solution at 70° C. for one minute, washed with water and dried. The following light-sensitive solutions (I) to (VI) were coated using a whirler on the aluminium plate obtained above and dried at 80° C. for 2 minutes to obtain a light-sensitive layer of 2.0 g/m² after drying.

The polyurethane resins of the invention used in light-sensitive solutions (I) to (VI) are shown in Table 2.

| Light-sensitive solution | |
|---|---|
| Polyurethane resin of the invention | 5.0 g |
| Trimethylolpropane triacrylate | 2.0 g |
| 2-(4-styrylphenyl)-4,6-bis(trichloromethyl)-S—triazine | 0.2 g |
| Dodecylbenzene sulfonate of condensate of 4-diazodiphenylamine and formaldehyde | 0.4 g |
| Oil soluble dye (Victoria Pure Blue BOH) | 0.1 g |
| Malic acid | 0.05 g |
| 2-methoxyethanol | 100 g |

Subsequently, the following polyurethane resin was used in light-sensitive solution (VII) for comparison instead of the polyurethane resins of the invention used in the aforesaid light-sensitive solutions. Light-sensitive solution (VII) was coated and dried in the same manner. The dry weight of the coated composition was 2.0 g/m².

(Polyurethane Resin Used in the Comparison Example)

This was a polyurethane resin having no carbon-carbon unsaturated bond which was obtained by reacting a part of carboxyl groups of the polyurethane resin prepared from the diisocyanate and diol compounds shown in Table 1 (k) with only ethylenebromohydrin. Its weight average molecular weight (polystyrene standard) was 45,000 and the content of the remaining carboxyl group was 1.20 meq/g.

Presensitized plates (I) to (VII) were obtained using light-sensitive solutions (I) to (VII), respectively, and each of them was imagewise exposed for 1 minute using a PS light of Fuji Photo Film Co., Ltd. at a distance of 1 m. Subsequently, each was dipped in the following developing solution at room temperature for one minute and rubbed lightly with absorbent cotton to remove the light-sensitive layer in unexposed areas. Thus, lithographic plates (I) to (VII) having light blue image were obtained.

| (Developing solution) | |
|---|---|
| Sodium sulfite | 5 g |
| Benzyl alcohol | 30 g |
| Sodium carbonate | 5 g |
| Sodium isopropylnaphthalene sulfonate | 12 g |
| Water | 1000 g |

Each printing plate was used for printing on wood free paper using the printing machine, Heidelberg KOR and an ink available in the market. The maximum number of the printed pieces of paper was examined for each of the lithographic printing plates (I) to (VII). The results are shown in Table 2.

TABLE 2

| Lithographic Printing Plate | Polymer Used | Maximum Number of Printed Pieces |
|---|---|---|
| I (Invention) | Polyurethane (g) of the Invention | 260,000 |
| II (Invention) | Polyurethane (i) of the Invention | 280,000 |
| III (Invention) | Polyurethane (k) of the Invention | 270,000 |
| IV (Invention) | Polyurethane (m) of the Invention | 250,000 |
| V (Invention) | Polyurethane (n) of the Invention | 270,000 |
| VI (Invention) | Polyurethane (o) of the Invention | 270,000 |
| VII (Invention) | Polyurethane of Comparison Example | 210,000 |

As seen from Table 2, lithographic printing plates (I) to (VI) with the polyurethane resins of the present invention yield the larger maximum numbers of the printed pieces of paper and thus are excellent in printing durability compared to printing plate (VII) for comparison.

What is claimed is:

1. A light-sensitive composition which comprises an admixture of a polyurethane resin having a carbon-carbon unsaturated bond and a carboxyl group, a monomer having at least one polymerizable, ethylenically unsaturated group, a photopolymerization initiator and/or a sensitizer and a diazonium compound, wherein the polyurethane resin has a basic skeleton of a reaction product of a diisocyanate compound represented by the following general formula (I) with a diol compound having a carboxyl group represented by general formula (II) or (III);

$$OCN-R_1-NCO \quad (I)$$

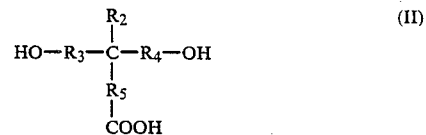

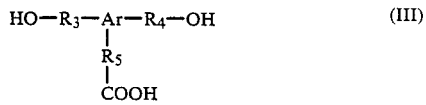

wherein, $R_1$ represents a divalent aliphatic or aromatic hydrocarbon which may have substituents; $R_2$ represents a hydrogen atom, alkyl, alkenyl, aralkyl, aryl, alkoxy or aryloxy group, all of which may have substituents; $R_3$, $R_4$ and $R_5$ may be same or different and represent a single bond or divalent aliphatic or aromatic hydrocarbon which may have substituents; or two or three out of $R_2$, $R_3$, $R_4$ and $R_5$ may form a ring; and Ar represents a trivalent aromatic hydrocarbon which may have substituents, and the carbon-carbon unsaturated bond is introduced into the polyurethane resin by:

(a) reacting a part of carboxyl groups of the compound of general formula (II) or (III) with a halogen compound or epoxy compound having a carbon-carbon unsaturated bond in the presence of a base, or (b) using a diol compound having a carbon-carbon unsaturated bond together with the diol compound of general formula (II) or (III), and the reaction product of said diisocyanate compound and said diol compound does not contain an isocyanate group.

2. The light-sensitive composition as described in claim 1, wherein the polyurethane resin further has a hydroxyl and /or nitrile group.

3. The light-sensitive composition as described in claim 1, wherein the diisocyanate compound is selected from the group consisting of 2,4-tolylene diisocyanate, a dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate, 3,3'-dimethylbiphenyl-4,4'-diisocyanate, hexamethylene diisocyanate, trimethylhexamethylene diisocyanate, lysin diisocyanate, dimeric acid diisocyanate, isophorone diisocyanate, 4,4'-methylenbis(cyclohexylisocyanate), methylcyclohexane-2,4(or 2,6)diisocyanate and 1,3-butyleneglycol and 2 moles of tolylene diisocyanate.

4. The light-sensitive composition as described in claim 1, wherein the diol compound is selected from the group consisting of 3,5-dihydroxybenzoic acid, 2,2-bis(-hydroxmymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid and tartaric acid.

5. The light-sensitive composition as described in claim 1, wherein the halogen compound or epoxy compound is selected from the group consisting of allyl bromide, 2-butenyl bromide, 1-phenyl-1-propenyl-3-bromide, 2-bromoethyl cinnamate, bromomethylstyrene, propargyl bromide, bromo-2-butine, the corresponding chlorine atom-containing compounds of the above bromine atom-containing compounds, allylglycidylether, 2-butenylglycidylether, 1-phenyl-propenylglycidylether, glycidylacrylate, glycidylmethacrylate, glycidylcinnamate and propargylglycidylether.

6. The light-sensitive composition as described in claim 1, wherein the diol compounds having a carbon-carbon unsaturated bond is selected from the group consisting of 2-butenediol, 4,4'-dihydroxystilbene, dihydroxyethylfumarate, dihydroxyethylmaleate, dihydroxyethyl p-phenylenediacrylate, 4,4'-dihydroxychalcone, 1,4-dihydroxy-2-butyne and 1,6-dihydroxy-2,4-hexadiyne.

7. The light-sensitive composition as described in claim 1, wherein the hydroxyl and/or nitrile group are introduced by reacting a part of carboxyl groups of the compound of general formula (II) or (III) with a halogen compound having a hydroxyl and/or nitrile group in the presence of a base.

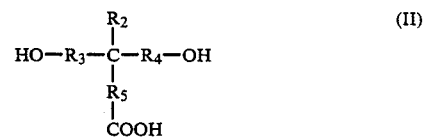

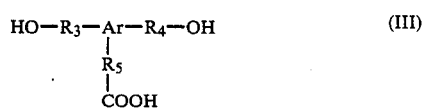

wherein $R_2$ represents a hydrogen atom, alkyl, alkenyl, aralkyl, aryl, alkoxy or aryloxy group, all of which may have substituents; $R_3$, $R_4$ and $R_5$ may be same or different and represent a single bond or divalent aliphatic or aromatic hydrocarbon which may have substituents; or two or three out of $R_2$, $R_3$, $R_4$ and $R_5$ may form a ring; and Ar represents a trivalent aromatic hydrocarbon which may have substituents.

8. The light-sensitive composition as described in claim 7, wherein the halogen compound is selected from the group consisting of ethylenebromohydrin, 3-bromopropanol, 4-bromobutanol, 1-bromo-2-propanol, 4-hydroxy-$\alpha$,3,5-tribromotoluene, cyanoethylbromide, 3-cyanopropylbromide, 4-cyanobutylbromide, 4-cyanobenzylbromide and chlorine atom-containing compounds corresponding to the above bromine atom-containing compounds.

9. The light-sensitive composition as described in claim 1, wherein a mole ratio of the diisocyanate compound to the diol compound is 0.8:1 to 1.2:1.

10. The light-sensitive composition as described in claim 1, wherein the weight average molecular weight of the polyurethane resin is 1000 to 100,000.

11. The light-sensitive composition as described in claim 1, wherein the polyurethane resin is contained in an amount of 30 to 95% by weight based on the weight of the composition.

12. The light-sensitive composition as described in claim 2, wherein the diazonium compound is selected from the group consisting of hexafluorophosphorate salt, tetrafluoroborate salt, sulfonate salts, phasphinate salts, and carboxylate salts of a condensate of P-diazodiphenylamine and formaldehyde, mesitylene sulfonates of a condensate of 3-methyoxy-4-diazo-diphenylamine and 4,4'-bis-methyoxy-methyldiphenylether.

13. The light-sensitive composition as described in claim 2, wherein the diazonium compound is contained in an amount of 1 to 50% by weight based on the weight of the composition.

14. A presensitized plate which comprises a support having provided thereon a light-sensitive layer containing a light-sensitive composition as defined in claim 1.

* * * * *